United States Patent

Sassa et al.

[11] Patent Number: 5,627,109
[45] Date of Patent: May 6, 1997

[54] METHOD OF MANUFACTURING A SEMICONDUCTOR DEVICE THAT USES A SAPPHIRE SUBSTRATE

[76] Inventors: Michinari Sassa, 57, Morinakamichi, Jimokuji-cho, Ama-gun, Aichi-ken, 490-11; Norikatsu Koide, 1-409-2, Amakota, Moriyama-ku, Nagoya-shi, Aichi-ken, 463, both of Japan

[21] Appl. No.: 529,134

[22] Filed: Sep. 15, 1995

[30] Foreign Application Priority Data

Sep. 16, 1994 [JP] Japan .................... 6-248834

[51] Int. Cl.$^6$ .................... H01L 21/302
[52] U.S. Cl. .................... 438/460; 438/479; 438/973
[58] Field of Search .................... 117/84; 437/225, 437/226

[56] References Cited

U.S. PATENT DOCUMENTS

| | | | |
|---|---|---|---|
| 3,878,008 | 4/1975 | Gleason et al. | 437/192 |
| 4,073,055 | 2/1978 | Kimura et al. | 437/226 |
| 4,313,809 | 2/1982 | Benyon et al. | 204/192 C |
| 4,476,620 | 10/1984 | Ohki et al. | 437/226 |
| 4,729,971 | 3/1988 | Coleman | 437/226 |
| 5,091,331 | 2/1992 | Delgado et al. | 437/62 |

FOREIGN PATENT DOCUMENTS 5-315646  11/1993  Japan.
5-343742  12/1993  Japan.

OTHER PUBLICATIONS

English Abstract of Laid–Open No. 5-315646 (315646/1993) in Japan.
English Abstract of Laid–Open No. 2-291147 (291147/1990) in Japan.

*Primary Examiner*—FeLisa C. Garrett
*Attorney, Agent, or Firm*—Cushman Darby Cushman Intellectual Property Group of Pillsbury Madison & Sutro LLP

[57] ABSTRACT

A sapphire wafer is sliced off parallel to a plane "a" {11$\bar{2}$0} so that patterns on its top surface are rectangular in shape as defined by an axis "c" (0001) and an axis "m" (10$\bar{1}$0). The sapphire wafer is fixed on a table. A scriber blade that is coated with synthetic diamond scribes the surface of the sapphire wafer so that scribe lines are formed in a checkered pattern. One of the scribe lines is inclined from axis "c" (001) by 20 to 70 degrees in a clockwise direction and the other scribe line is inclined from the axis "c" (001) by 20 to 70 degrees in a counterclockwise direction. After scribing, pressure is applied by a roller along the scribe lines so as to cause the sapphire wafer to break into a sapphire chip. The yield of sapphire chips is increased by the use of this method because chipping is less likely to occur.

17 Claims, 3 Drawing Sheets

METHOD OF MANUFACTURING A SEMICONDUCTOR DEVICE THAT USES A SAPPHIRE SUBSTRATE

BACKGROUND OF THE INVENTION

1. Field of the Invention

The present invention relates to a method for dicing a sapphire wafer for light-emitting devices such as light emitting diodes (LED) and laser diodes, which emit visible short-wave rays in the blue region of the optical spectrum. The invention further relates to a manufacturing method for gallium nitride compound semiconductor that utilizes a sapphire substrate wherein the above dicing method is utilized.

2. Description of the Related Art

A sapphire ($Al_2O_3$) has been used as an insulative substrate for epitaxially growing gallium nitride (GaN) compound layers thereon.

A wafer of sapphire having semicondutor layers thereon is diced into chips by rotating a blade laminated with synthetic diamonds at high speed.

Since sapphire is harder than silicon, gallium arsenide, and so forth, dicing the sapphire wafer requires a blade with a wider width to rotate at higher speed and higher torque. Accordingly, the sapphire wafer diced by that blade produces chips with cracked edges (called chipping), dropping electrodes, and so forth. Consequently, many defective chips are produced by the conventional sawing method for dicing sapphire wafer.

In order to solve the chipping problem, several means have been proposed. Kotaki et al. discloses in Japanese Patent Application with Laid-Open No. 291147/1990 (2-291147) a dicing method of cutting a sapphire wafer, whose main surface is "a" $\{11\bar{2}0\}$, along a boundary crossing an axis "c" (0001) at 55 degrees or lower. Iwasa et al. discloses in Japanese Application with Laid Open No. 315646/1993 (5-315646) a method of cutting a sapphire wafer by cutting a groove deeper than the thickness of a GaN compound semiconductor layer on the sapphire wafer by a dicer, applying a scribing line by a scriber, and breaking the sapphire wafer into chip shaped dice using a load provided by a roller.

However, utilizing surface "a" $\{11\bar{2}0\}$ of the sapphire wafer without defective chips has been difficult despite the proposed methods by Kotaki et al. and Iwasa et al. Extensive chipping is inevitable by the method of Kotaki et al., when the sapphire wafer is diced crossing an axis "m" $(10\bar{1}0)$, which is a perpendicular in direction to the axis "c" (0001). Iwasa et al. inevitably uses the sapphire wafer whose main surface is "c" {0001}, because breaking the sapphire wafer to the direction of the axis "m" $(10\bar{1}0)$ has been impossible by the grooving/scribing/rolling method of Iwasa et al.

SUMMARY OF THE INVENTION

It is therefore an object of the present invention to divide the sapphire wafer whose main surface is "a" $\{11\bar{2}0\}$ into chips without defects.

According to the first aspect of the invention, there is provided a method of manufacturing a semiconductor device comprising the steps of:

utilizing a sapphire as a substrate;

forming semiconductor layers on a surface "a" $\{11\bar{2}0\}$ of the sapphire substrate;

fixing a boundary between chips by two directional lines, each crossing an axis "c" (0001) and each making an angle less than 90 degrees to the axis "c" (0001);

forming scribe lines by use of a scriber along the two directional lines; and breaking the sapphire substrate along the scribe lines by applying external energy.

According to the second aspect of the invention, the angle of the two directional lines to the axis "c" (0001) ranges from 20 to 70 degrees.

According to the third aspect of the invention, the angle of the two directional lines to the axis "c" (0001) ranges 30 from to 60 degree.

According to the fourth aspect of the invention, the sapphire substrate has a thickness in the range of 60 to 120 μm.

According to the fifth aspect of the invention, the sapphire substrate has a thickness in the range of 80 to 100 μm.

On the sapphire wafer which is sliced off in parallel to a plane "a" $\{11\bar{2}0\}$, a boundary between chips is formed by two directional lines. Each directional line crosses an axis "c" (0001) and makes an angle of less than 90 degrees to the axis "c" (0001). A scribe line is drawn by a scriber along the two directional lines. Then, the sapphire substrate is diced along the scribe line by applying external energy.

Dicing the sapphire wafer was found to be easier if the axis "m" $(10\bar{1}0)$ is avoided on the surface "a" $\{11\bar{2}0\}$. As a result, the method of the present invention utilizes the surface "a" $\{11\bar{2}0\}$ of the sapphire as a substrate.

Other objects, features, and characteristics of the present invention will become apparent upon consideration of the following description, the appended claims,and with reference to the accompanying drawings, all of which form a part of the disclosure, and wherein referenced numerals designate corresponding parts in the various figures.

DETAILED DESCRIPTION OF THE EXEMPLARY EMBODIMENT

The invention may be more fully understood by reference to the following examples.

EXAMPLE 1

Figure 1:
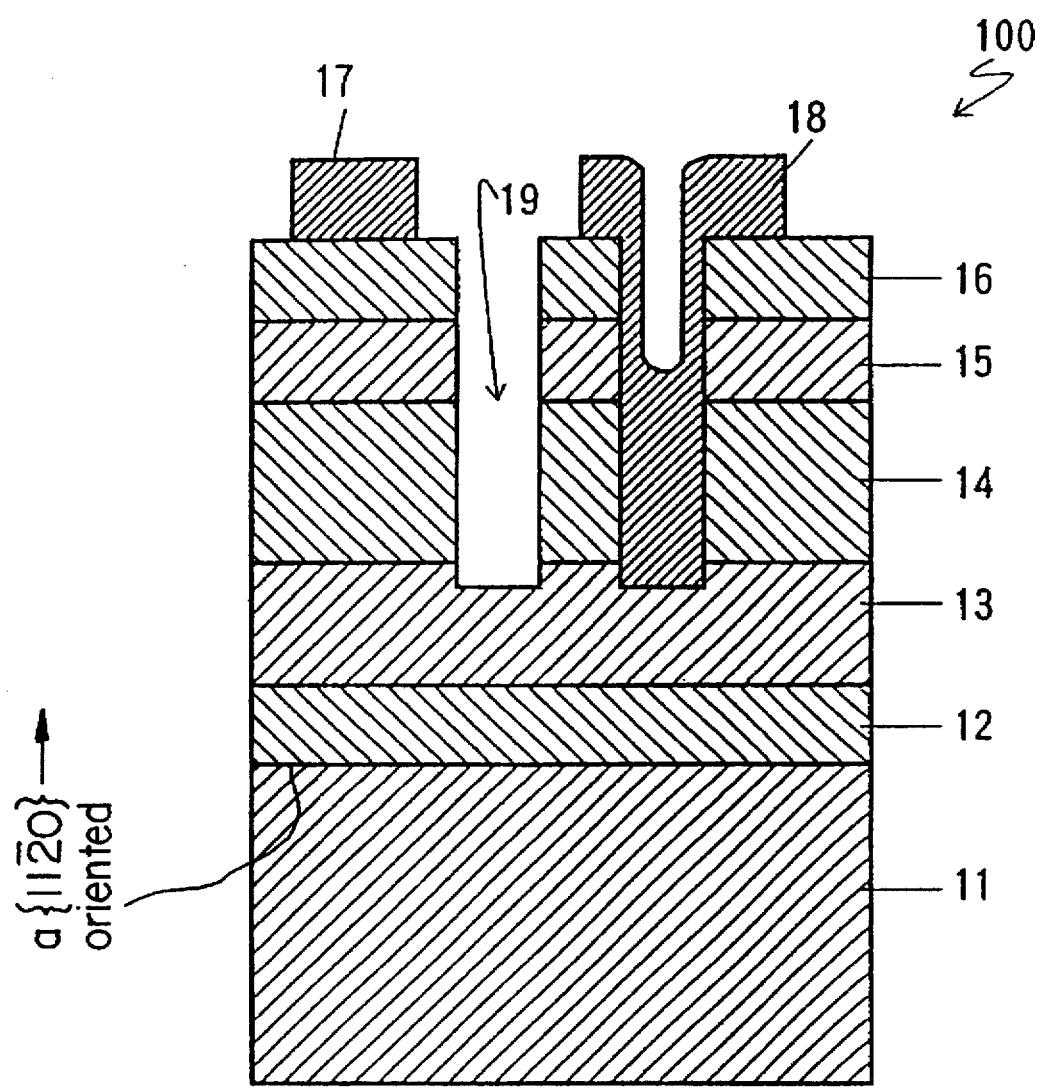
FIG. 1 is a cross sectional view showing the structure of the LED in Examples 1 to 4.

FIG. 1 shows a LED 100 embodied in Example 1. It has a sapphire ($Al_2O_3$) substrate 11 upon which the following five layers are consecutively formed: an AlN buffer layer 12; a silicon (Si) doped GaN $n^+$-layer 13 of high carrier (n-type) concentration; a Si-doped $(Al_{x2}Ga_{1-x2})_{y2}In_{1-y2}N$ $n^+$-layer 14 of high carrier (n-type) concentration; a zinc (Zn) and Si-doped $(Al_{x1}Ga_{1-x1})_{y1}In_{1-y1}N$ emission layer 15; and a Mg-doped $(Al_{x2}Ga_{1-x2})_{y2}In_{1-y2}N$ p-layer 16. The AlN buffer layer 12 has a thickness of 500 A. The GaN $n^+$-layer 13 is about 2.0 μm in thickness and has a $2\times10^{18}/cm^3$ electron concentration. The $n^+$-layer 14 is about 2.0 μm in thickness and has a $2\times10^{18}/cm^3$ electron concentration. The emission layer 15 is about 0.5 μm in thickness. The p-layer 16 is about 1.0 μm in thickness and has a 2×10$^{17}$/cm$^3$ hole concentration. Nickel electrodes 17 and 18 are connected to the p-layer 16 and the n$^+$-layer 14, respectively. The electrodes 17 and 18 are electrically insulated from one another by a groove 19.

A method for a dicing sapphire wafer 1 is explained hereinafter.

Figure 2:
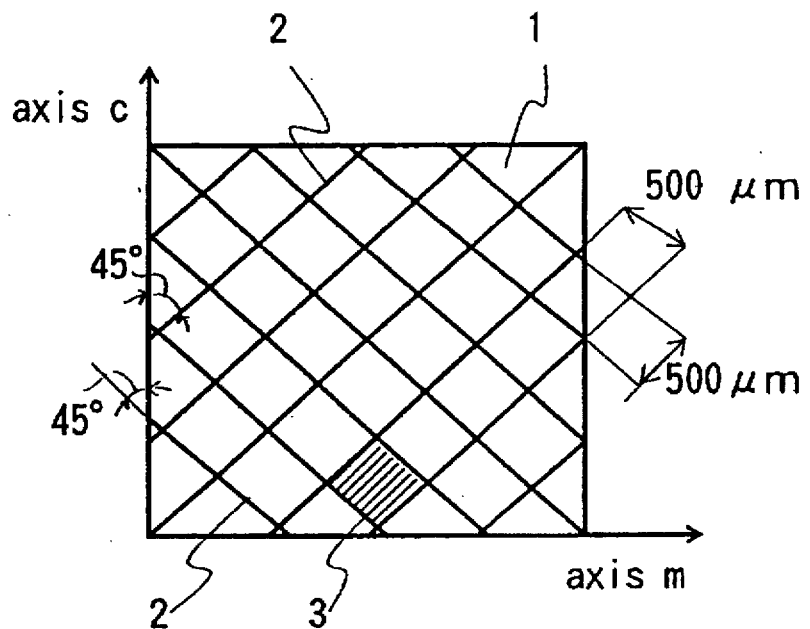
FIG. 2 is a view explaining the scribing pattern in Example 1.

The sapphire wafer 1 is sliced off in parallel to a plane "a" {11$\bar{2}$0}. FIG. 2 shows the pattern on its surface, which is rectangular in shape and has; an axis "c" (0001) and an axis "m" (10$\bar{1}$0) as its two sides. The sapphire wafer 1 is designed to be 150 μm thickness.

The buffer layer 12 and semiconductor layers 13, 14, 15, and 16, are formed successively by a conventional MOCVD (metal organic chemical vapor deposition) method. Conventional etching processes are carried out utilizing photolithography.

Then, the sapphire wafer 1 is fixed on a table for the scribing process. The table has an x axis and a y axis is movable in parallel to those axes, and is horizontal rotatable by 180 degrees.

A scriber blade coated with synthetic diamond scribes the surface of the sapphire wafer 1, which is fixed on the table, so that scribe lines 2 are formed thereon in a checkered pattern. The scribe lines 2 are constituted by two directional lines. One of the directional lines is inclined from the axis "c" (0001) by 45 degrees in a clockwise direction and the other directional line is inclined from the axis "c" (0001) by 45 degrees in a counterclockwise direction. The length of each side is 500 μm. The load applied to the scriber blade is 100 g.

After the scribe lines 2 are formed on the surface of the sapphire wafer 1, pressure is applied by a roller along the scribe lines 2 resulting in controlled fracturing or breaking the sapphire wafer 1 and obtaining a sapphire chip 3. The weight of the roller is 3 Kg.

Wiring and other necessary processes are then carried out to the sapphire chip 3 resulting in obtaining the LED 100 as shown in FIG. 1.

By use of the dicing method described above the sapphire chip 3 of 500 μm on each side is produced without undesired chipping, and thus significantly enhancing the yield per sapphire wafer 1.

The sapphire wafer 1 can be diced after either surface side is scribed as was done in the above embodiment. Dicing of the sapphire wafer 1, however, can be performed after both surface sides are scribed.

EXAMPLE 2

Figure 3:
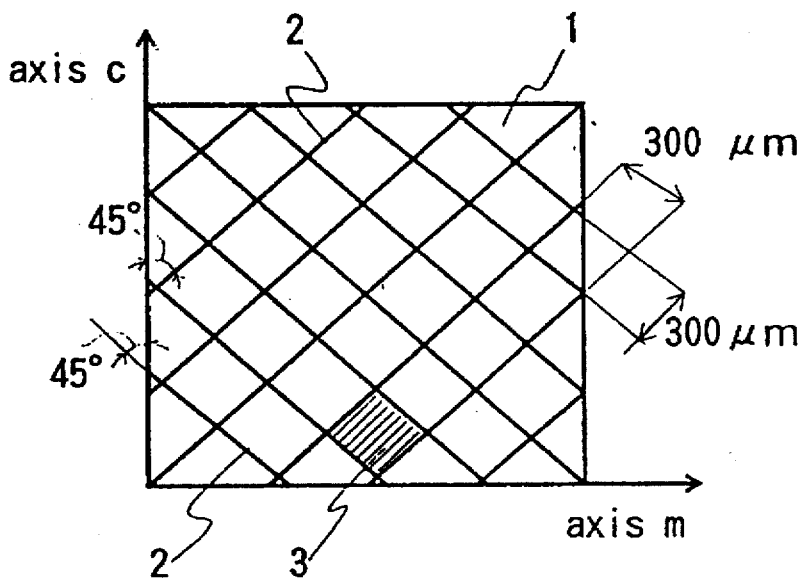
FIG. 3 is a view explaining the scribing pattern in Example 2.

FIG. 3 explains another method of dicing the sapphire wafer 1.

Differences between Examples 1 and 2 reside in the thickness of the sapphire substrate 1 and the length of each side. In this embodiment, the thickness of the sapphire substrate 11 is 100 μm which is thinner than that of Example 1. The length of each side of the resulting chip 3 in this embodiment is 300 μm which was smaller than that of Example 1. Other manufacturing processes of layers and conditions such as the load applied to the blade and the weight of the roller are the same as those of Example 1.

In this embodiment, it is shown that a sapphire chip 3 can be produced without chipping even when its size is 500 μm square or smaller. Consequently, such a sapphire chip 3 can result in the manufacturing of a relatively smaller size device thereon.

EXAMPLE 3

Figure 4:
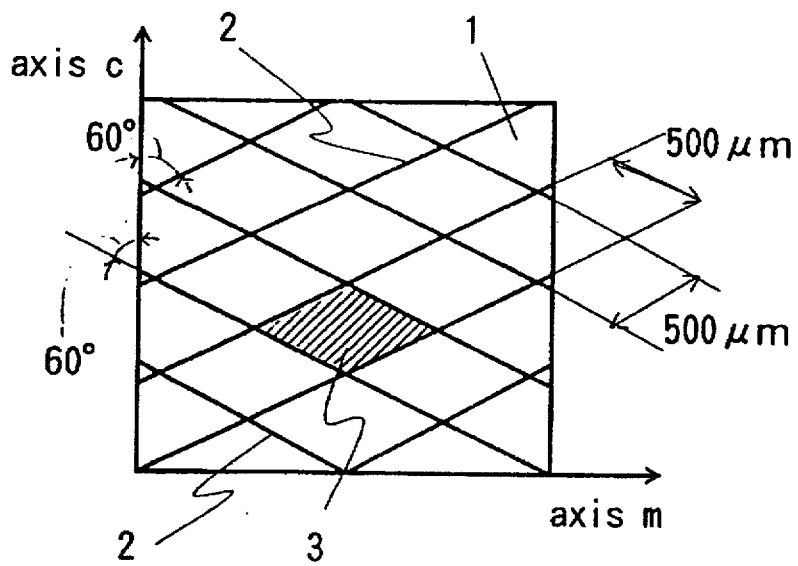
FIG. 4 is a view explaining the scribing pattern in Example 3.

FIG. 4 explains another method of dicing the sapphire wafer 1.

A difference between Examples 1 and 3 resides in the angle the scribe line 2 create compared to the axis "c" (0001). In Example 3, one of the two directional lines is inclined from the axis "c" (0001) by 60 degrees in a clockwise direction and the other directional line is inclined from the axis "c" (0001) by 60 degrees in a counterclockwise direction. Other manufacturing processes of the semiconductor layers and the conditions such as the load applied to the blade are the same as those of Example 1.

In this embodiment, the sapphire chip 3 of 500 μm square is produced without chipping even though the angles made by the two directional lines create compared to the axis "c" are 55 degrees or larger. Consequently, such a sapphire chip 3 allows for flexibility in the structure of the semiconductor device manufactured thereon.

EXAMPLE 4

Figure 5:
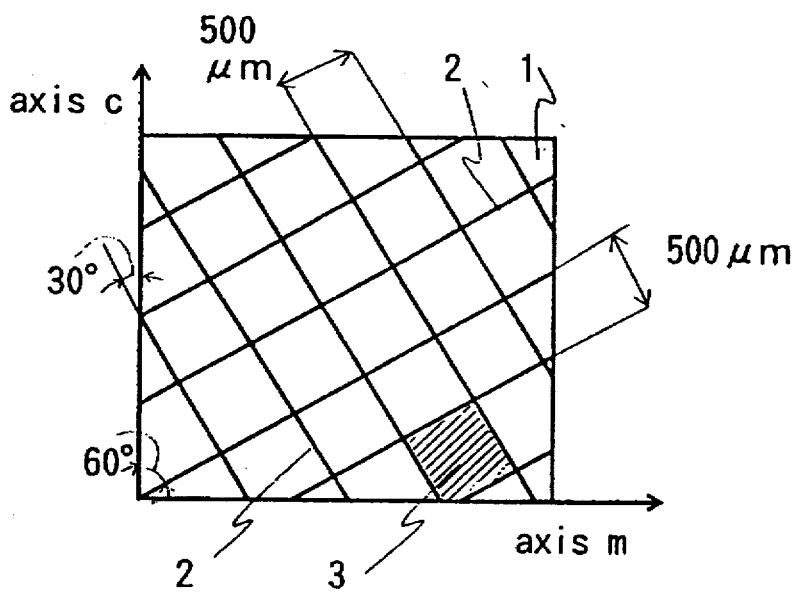
FIG. 5 is a view explaining the scribing pattern in Example 4.

FIG. 5 explains another method dicing of the sapphire wafer 1.

A difference between Examples 1 and 4 resides in the angle the scribe line 2 create compared to the axis "c" (0001). In Example 4, one of the two directional lines inclined from the axis "c" (0001) by 60 degrees in a clockwise direction and the other directional line is inclined from the axis "c" (0001) by 30 degrees in a counterclockwise direction. Other manufacturing processes of the semiconductor layers and the conditions such as the load applied to the blade are the same as those of Example 1.

In this embodiment, the sapphire chip 3 of 500 μm square is produced without chipping even though; one of the angles created by one of the two directional lines compared to the axis "c" (0001) is 55 degrees or larger. Consequently, such a sapphire chip 3 enhances the flexibility of the structure of a device manufactured thereon.

In Examples 1 to 4, the greater the angle created by the two directional lines to the axis "m" (10$\bar{1}$0), the better the yield of semiconductor devices (i.e., more are produced without chipping). The preferable angle ranges from 20 to 70 degrees and in particular, from 30 to 60 degrees.

Although a thin sapphire wafer 1 is preferable for manufacturing semiconductor devices thereon, a certain thickness is required for bearing the loads applied to the devices. The preferable thickness of the sapphire wafer 1 ranges from 60 to 120 μm, with the most preferable thickness ranging from 80 to 100 μm.

When the scribe line 2 is formed on the sapphire wafer 1, the preferable depth of the scribe line 2 ranges from 5 to 10 μm.

The dicing methods described in Examples 1 to 4 can be used for a sapphire substrate on which no semiconductor layers have been formed.

While the invention has been described in connection with what are presently considered to be the most practical and exemplary embodiments, it is to be understood that the invention is not to be limited to the disclosed embodiments, but on the contrary, is intended to cover various modifications and equivalent arrangements that are included within the spirit and scope of the appended claims.

What is claimed is:

1. A method of manufacturing a semiconductor device comprising the steps of:

utilizing a sapphire as a wafer;

forming at least one semiconductor layer on a crystal surface "a" {11$\bar{2}$0} of said sapphire wafer;

fixing boundaries so as to define chips by use of two directional lines on said sapphire wafer, each said directional line crossing an axis "c" (0001) and making an angle of less than 90 degrees to said axis "c" (0001);

forming scribe line by use of a scriber along said two directional lines; and breaking said sapphire wafer along said scribe lines by applying external energy thereto.

2. A method of manufacturing a semiconductor device according to claim 1, wherein one of said two directional lines is less than 90 degrees as measured in a clockwise direction from said axis "c" (0001) and another of said two directional lines is less than 90 degrees as measured in a counterclockwise direction from said axis "c"(0001).

3. A method of manufacturing a semiconductor device according to claim 1, wherein said scribe lines are formed in said at least one semiconductor layer.

4. A method of manufacturing a semiconductor device according to claim 1, wherein said scribe lines are formed in opposite sides of side sapphire wafer.

5. A method of manufacturing a semiconductor device according to claim 4 wherein a depth of said scribe lines ranges from 5 to 10 μm.

6. A method of manufacturing a semiconductor device according to claim 1 wherein a depth of said scribe lines ranges from 5 to 10 μm.

7. A method of manufacturing a semiconductor device comprising the steps of:

utilizing a sapphire as a wafer;

forming at least one semiconductor layer on a crystal surface "a" {11$\bar{2}$0} of said sapphire wafer;

fixing boundaries so as to define chips by use of two directional lines on said sapphire wafer, each said directional line crossing an axis "c" (0001) and making an angle that ranges from 20 to 70 degrees to said axis "c" (0001);

forming scribe lines by use of a scriber along said two directional lines; and breaking said sapphire wafer along said scribe lines by applying external energy thereto.

8. A method of manufacturing a semiconductor device according to claim 7, wherein one of said two directional lines ranges from 20 to 70 degrees as measured in a clockwise direction from said axis "c" (0001) and another of said two directional lines ranges from 20 to 70 degrees as measured in a counterclockwise direction from said axis "c" (0001).

9. A method of manufacturing a semiconductor device according to claim 7, wherein said scribe lines are formed in said at least one semiconductor layer.

10. A method of manufacturing a semiconductor device according to claim 7, wherein said scribe lines are formed in opposite sides of said sapphire wafer.

11. A method of manufacturing a semiconductor device according to claim 10 wherein a depth of the scribe lines ranges from 5 to 10 μm.

12. A method of manufacturing a semiconductor device according to claim 7 wherein a depth of said scribe lines ranges from 5 to 10 μm.

13. A method of manufacturing a semiconductor device comprising the steps of:

utilizing a sapphire as a wafer;

forming at least one semiconductor layer on a crystal surface "a" {11$\bar{2}$0} of said sapphire wafer;

fixing boundaries so as to define chips by use of two directional lines on said sapphire wafer, each said directional line crossing an axis "c" (0001) and making an angle that ranges from 30 to 60 degrees to said axis "c" (0001);

forming scribe lines by use of a scriber along said two directional lines; and breaking said sapphire wafer along said scribe lines by applying external energy thereto.

14. A method of manufacturing a semiconductor device according to claim 13, wherein one of said two directional lines ranges from 20 to 70 degrees as measured in a clockwise direction from said axis "c" (0001) and another of said two directional lines ranges from 20 to 70 degrees as measured in a counterclockwise direction from said axis "c" (0001).

15. A method of manufacturing a semiconductor device comprising the steps of:

utilizing a sapphire as a wafer, wherein said sapphire wafer has a thickness in the range of 60 to 120 μm;

forming at least one semiconductor layer on a crystal surface "a" {11$\bar{2}$0} of said sapphire wafer;

fixing boundaries so as to define chips by use of two directional lines on said sapphire wafer, each said directional line crossing an axis "c" (0001) and making an angle of less than 90 degrees to said axis "c" (0001);

forming scribe lines by use of a scriber along said two directional lines; and breaking said sapphire wafer along said scribe lines by applying external energy thereto.

16. A method of manufacturing a semiconductor device comprising the steps of:

utilizing a sapphire as a wafer, wherein said sapphire wafer has a thickness in the range of 80 to 100 μm;

forming at least one semiconductor layer on a crystal surface "a" {11$\bar{2}$0} of said sapphire wafer;

fixing boundaries so as to define chips by use of two directional lines on said sapphire wafer, each said directional line crossing an axis "c" (0001) and making an angle of less than 90 degrees to said axis "c" (0001);

forming scribe lines by use of a scriber along said two directional lines; and breaking said sapphire wafer along said scribe lines by applying external energy thereto.

17. A method of manufacturing a semiconductor device comprising the steps of:

utilizing sapphire as a wafer;

forming at least one semiconductor layer on a crystal surface "a" {11$\bar{2}$0} of said sapphire wafer;

fixing boundaries on said sapphire wafer so as to define chips by use of a plurality of first directional lines and a plurality of second directional lines, each said first directional line being parallel to another said first directional line, crossing an axis "c" (0001), and making an angle of less than 90 degrees to said axis "c" (0001), and each said second directional line being parallel to another said second directional line, crossing said axis "c" (0001), and making an angle of less than 90 degrees to said axis "c" (0001);

forming scribe lines by use of a scriber along at least two of said plurality of first directional lines and along at least two of said plurality of second directional lines; and breaking said sapphire wafer along said scribe lines by applying external energy thereto.

* * * * *

UNITED STATES PATENT AND TRADEMARK OFFICE
CERTIFICATE OF CORRECTION

PATENT NO. : 5,627,109

DATED : May 6, 1997

INVENTOR(S) : Sassa et al

It is certified that error appears in the above-indentified patent and that said Letters Patent is hereby corrected as shown below:

On the Title page, please insert the following item:

--[73]  Assignee: Toyoda Gosei Co., Ltd.,
        Nishikasugai-gun, Japan--

Signed and Sealed this

Second Day of September, 1997

Attest:

BRUCE LEHMAN

Attesting Officer

Commissioner of Patents and Trademarks